(12) United States Patent
Baudot et al.

(10) Patent No.: US 11,837,678 B2
(45) Date of Patent: Dec. 5, 2023

(54) GERMANIUM PHOTODIODE

(71) Applicant: STMicroelectronics (Crolles 2) SAS, Crolles (FR)

(72) Inventors: Charles Baudot, Lumbin (FR); Sebastien Cremer, Sassenage (FR); Nathalie Vulliet, Crolles (FR); Denis Pellissier-Tanon, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 87 days.

(21) Appl. No.: 17/486,219

(22) Filed: Sep. 27, 2021

(65) Prior Publication Data

US 2022/0013681 A1 Jan. 13, 2022

Related U.S. Application Data

(62) Division of application No. 16/294,645, filed on Mar. 6, 2019, now Pat. No. 11,145,779.

(30) Foreign Application Priority Data

Mar. 7, 2018 (FR) ...................................... 1851989

(51) Int. Cl.
| | | |
|---|---|---|
| *H01L 27/146* | (2006.01) | |
| *H01L 31/109* | (2006.01) | |
| *H01L 31/18* | (2006.01) | |
| *H01L 31/0232* | (2014.01) | |
| *H01L 31/028* | (2006.01) | |
| *H01L 31/105* | (2006.01) | |

(52) U.S. Cl.
CPC .......... *H01L 31/109* (2013.01); *H01L 31/028* (2013.01); *H01L 31/02327* (2013.01); *H01L 31/105* (2013.01); *H01L 31/1804* (2013.01)

(58) Field of Classification Search
None
See application file for complete search history.

(56) References Cited

U.S. PATENT DOCUMENTS

2007/0004067 A1 1/2007 Hsu et al.
2009/0101909 A1* 4/2009 Chen .................... H01L 31/1808
257/65

(Continued)

FOREIGN PATENT DOCUMENTS

CN 101937938 A 1/2011
CN 101669218 A 1/2012

(Continued)

OTHER PUBLICATIONS

First Office Action and Search Report for family related CN Appl. No. 201910169561.7, report dated Apr. 24, 2022, 14 pgs.

(Continued)

*Primary Examiner* — Joseph C. Nicely
*Assistant Examiner* — Lamont B Koo
(74) *Attorney, Agent, or Firm* — CROWE & DUNLEVY

(57) ABSTRACT

A photodiode includes an active area formed by intrinsic germanium. The active area is located within a cavity formed in a silicon layer. The cavity is defined by opposed side walls which are angled relative to a direction perpendicular to a bottom surface of the silicon layer. The angled side walls support epitaxial growth of the intrinsic germanium with minimal lattice defects.

22 Claims, 3 Drawing Sheets

(56) References Cited

U.S. PATENT DOCUMENTS

| | | | |
|---|---|---|---|
| 2011/0037133 A1* | 2/2011 | Su | H01L 31/1808 |
| | | | 257/E31.127 |
| 2011/0049568 A1 | 3/2011 | Ochtefeld et al. | |
| 2011/0223706 A1 | 9/2011 | Hildreth et al. | |
| 2013/0039664 A1 | 2/2013 | Clifton et al. | |
| 2015/0016769 A1 | 1/2015 | Verma et al. | |
| 2015/0293383 A1 | 10/2015 | Cunningham et al. | |
| 2015/0325736 A1 | 11/2015 | Knoll et al. | |

FOREIGN PATENT DOCUMENTS

| | | |
|---|---|---|
| CN | 104282794 A | 1/2015 |
| CN | 209729919 U | 12/2019 |
| WO | 2015187222 A2 | 12/2015 |

OTHER PUBLICATIONS

Search Report for counterpart CN Appl. No. 201910169561.7 dated Oct. 5, 2022, 4 pgs.

INPI Search Report and Written Opinion for FR 1851989 dated Oct. 24, 2018 (9 pages).

Nicole Ann Dilello: "Fabrication and characterization of germanium-on-silicon photodiodes", Massachuetts Institute of Technology, février 2012 (Dec. 2012), XP055464188, Extrait de l'Internet: URL:https://pdfs.semanticscholar.org/d2d2/d4147e59a2b7952b05c225b4ebcdd9643be5.pdf abrégé; figures 3.10, 3.12, 3.13,3.16,3.19 Chapter 3 "Photodiodes fabricated using selectively grown germanium"; pp. 39-p. 68.

* cited by examiner

GERMANIUM PHOTODIODE

CROSS REFERENCE TO RELATED APPLICATIONS

This application is a divisional of U.S. patent application Ser. No. 16/294,645, filed Mar. 6, 2019, which claims the priority benefit of French Application for Patent No. 1851989, filed on Mar. 7, 2018, the contents of which are hereby incorporated by reference in their entireties to the maximum extent allowable by law.

TECHNICAL FIELD

The present disclosure relates to photonics and, more particularly, to converters of light signals into electric signals or opto-electric converters.

BACKGROUND

Optical fibers enable to transfer data in the form of light signals, which are then converted into electric signals.

The speed of data transfer through an optical fiber is limited by the electro-optical converters (modulators) and optoelectric converters (demodulators or photodetectors) respectively located upstream and downstream of the optical fiber.

Current technologies of converters of light signals into electric signals, for example, allow a transfer speed of approximately 25 Gbps (Gigabits per second).

It would be desirable to be able to increase the transfer speed.

SUMMARY

In an embodiment, a photodiode comprises an active area, the active area including at least one first germanium region in a first silicon layer, the first germanium region having, in cross-sections along planes orthogonal to the plane of the first layer, only two sides in contact with the first layer.

According to an embodiment, each of said sides forms an angle greater than approximately 10° with the direction orthogonal to the plane of the first layer.

According to an embodiment, the plane of the first layer is defined by a reference frame formed by the two longest sides of the first layer.

According to an embodiment, said angle is between approximately 10° and approximately 20° with the direction orthogonal to the plane of the first layer.

According to an embodiment, the first layer rests on a second layer made of an insulating material.

According to an embodiment, the first region is in contact with the second layer.

According to an embodiment, the width of the first region is smaller than approximately 700 nm.

According to an embodiment, the width of the first region is in the range from approximately 400 to approximately 600 nm.

According to an embodiment, the active area comprises a second germanium region outside of the first layer.

An embodiment provides an opto-electric converter comprising a photodiode such as previously described.

According to an embodiment, the converter comprises a waveguide.

According to an embodiment, the waveguide comprises trenches of an insulating material delimiting an area of the first layer, said area being capable of receiving light signals.

According to an embodiment, the first region is located in said area.

According to an embodiment, a voltage is measured between portions of the first layer, the portions being separated from the first region by trenches made of an insulating material.

According to an embodiment, the height of the trenches is substantially equal to half the thickness of the first layer.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1A:
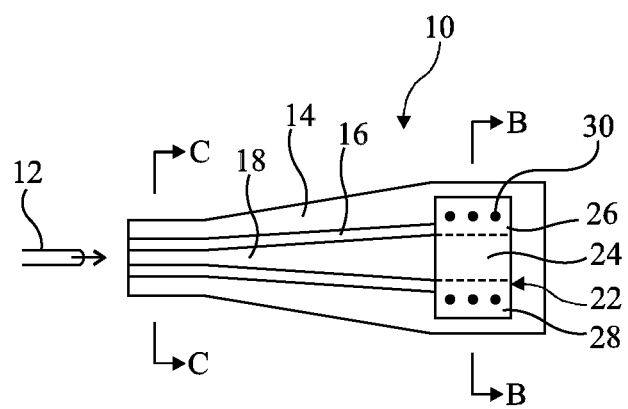
FIGS. 1A to 1C respectively are a top view and cross section views along planes B-B and C-C, schematically illustrating an example of a converter of light signals into electric signals.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred to the orientation of the concerned elements in the drawings. The terms "approximately", "substantially", "about", and "in the order of" are used herein to designate a tolerance of plus or minus 10%, preferably of plus or minus 5%, of the value in question.

Figure 1B:
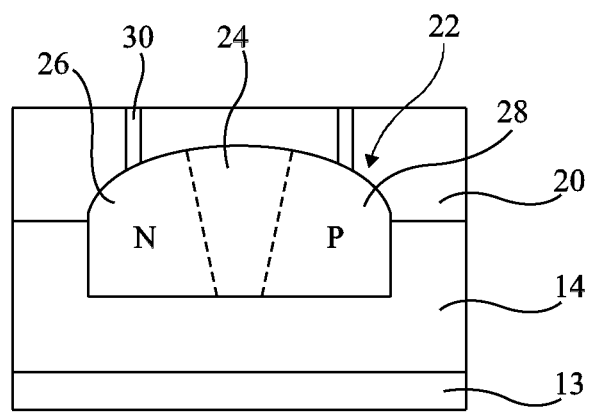
Figure 1C:
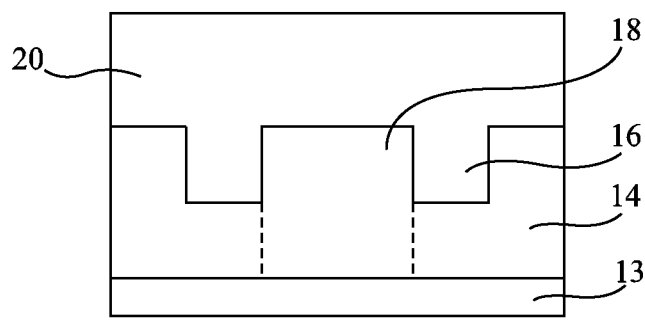

FIGS. 1A to 1C, respectively, are a top view and cross section views along planes B-B and C-C of FIG. 1A schematically illustrating a converter 10 of light signals into electric signals.

Converter 10 receives a light signal at an input from an optical fiber 12. Optical fiber 12 and converter 10 may, for example, be separated by an optical circuit having multiplexing functions, or a device capable of receiving and of transmitting the optical signal originating from the fiber. Converter 10 comprises a substrate, not shown, for example, made of silicon. The substrate is covered with a layer 13 of insulator (FIGS. 1B and 1C). Layer 13 is covered with a silicon layer 14. Trenches 16 (FIGS. 1A and 1C), filled with insulator, are formed in layer 14. The height of trenches 16 is substantially equal to half the thickness of layer 14. Trenches 16 delimit a region 18, delimited by dotted lines in FIG. 1C. Layer 14 is further covered with a layer 20 of insulator, not shown in FIG. 1A.

Region 18, horizontally delimited by trenches 16 and vertically delimited by layers 13 and 20, forms a waveguide spindle, that is, the region where the light signal propagates. Indeed, silicon is transparent for the considered wavelengths and the insulator of trenches 16 and of layers 13 and 20 is selected to have a refraction index sufficiently different from that of silicon to contain the light signal. For example, trenches 16 and layers 13 and 20 are made of silicon oxide, having a 1.45 refraction index, while the refraction index of silicon is 3.5.

Converter 10 further comprises a photodiode comprising a germanium block 22. Block 22 comprises an intrinsic central portion 24, located opposite the end of the waveguide spindle formed by region 18. Portion 24 forms the active area of the photodiode from an optical viewpoint, that is, the photosensitive area. Block 22 also comprises an N-type doped portion 26 (the left-hand portion in FIG. 1B) and a P-type doped portion 28 (the right-hand portion in FIG. 1B).

Trenches 16 are more distant from each other close to the photodiode than to the input, to widen region 18 as the distance from the optical fiber increases.

Central portion 24 creates charge carriers when a light signal reaches it. Thus, the voltage measured between portions 26 and 28 (via conductive vias 30 crossing layer 20) is representative of the data transmitted by the light signal.

The data transfer speed in converter 10, that is, the frequency at which data can be read, is dependent on the capacitance of intrinsic portion 24 and thus on the width of portion 24 (the distance between regions 26 and 28). The data transfer speed is also dependent on the resistance between portion 24 and vias 30.

Germanium block 22, for example, has a 1.6-µm width, and the maximum distance between regions 26 and 28 is, for example, approximately 700 nm. Such a structure enables to transfer data at a 25-Gbps speed.

Portions 26 and 28 having been formed by doping intrinsic germanium, the limits between portions 26 and 28, and portion 24, have a low accuracy and are difficult to control, which makes the capacitance control also difficult.

To control the width of intrinsic portion 24 and to be able to decrease it, it is desired to form a converter only comprising an intrinsic germanium block and comprising no doped germanium (doped portions 26 and 28).

FIGS. 2A, 2B, 3A, 3B, 4A, and 4B illustrate a method of manufacturing an embodiment of an opto-electric converter.

Figure 2A:
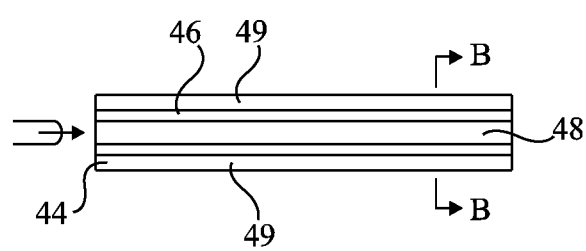
FIGS. 2A and 2B respectively are a top view and a cross-section view along plane B-B schematically illustrating a step of manufacturing of an embodiment of a converter of light signals into electric signals.
Figure 2B:
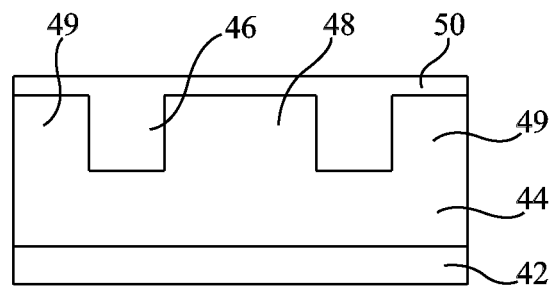

FIGS. 2A and 2B respectively are a top view and a cross-section view along plane B-B of FIG. 2A schematically illustrating a manufacturing step during which a waveguide similar to the waveguide illustrated in FIG. 1C is formed.

During this step, a layer 42 of insulator is formed on a substrate, not shown. A silicon layer 44 is also formed on layer 42. Trenches 46 are etched in layer 44 to delimit a central region 48, or central area, where the light signal will propagate (i.e., the waveguide spindle), and two portions 49 of layer 44. Each trench 46 separates region 48 from a portion 49. A layer 50 of insulator (not shown in FIG. 2A) is then deposited to fill trenches 46 and to cover layer 44. Layer 50 may also be a stack of insulating layers, for example, made of silicon nitride and of silicon oxide.

The plane of layer 44 is defined by a reference frame formed by the two longest sides of layer 44. The plane of layer 44 thus, for example, corresponds to the plane of the low surface of layer 44 or to a plane parallel to this plane.

Portions 49 are delimited on one side by trenches 46 and on the other side by insulating trenches, not shown, which, for example, reach insulator layer 42 to insulate the converter from neighboring components.

The height of trenches 46 is, for example, equal to half the thickness of layer 44. The thickness of layer 50 is, for example, in the range from approximately 10 nm to approximately 100 nm. The thickness of layer 44 is, for example, in the range from approximately 250 nm to approximately 350 nm, for example, approximately 300 nm, and the height of trenches 46 is, for example, in the range from approximately 125 nm to approximately 175 nm, for example, approximately 150 nm. The width of region 48, that is, the distance between the two trenches 46, is, for example, in the range from approximately 600 nm to approximately 800 nm. The width of trenches 46 is, for example, in the range from approximately 400 nm to approximately 900 nm. The width of portions 49 is, for example, in the range from approximately 300 nm to approximately 500 nm.

Figure 3A:
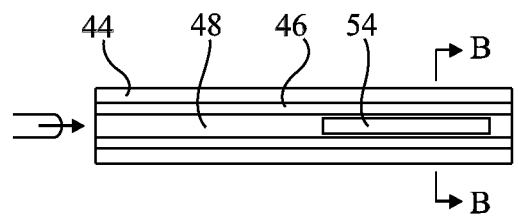
FIGS. 3A and 3B respectively are a top view and a cross-section view along plane B-B schematically illustrating another step of manufacturing of an embodiment of a converter of light signals into electric signals.
Figure 3B:
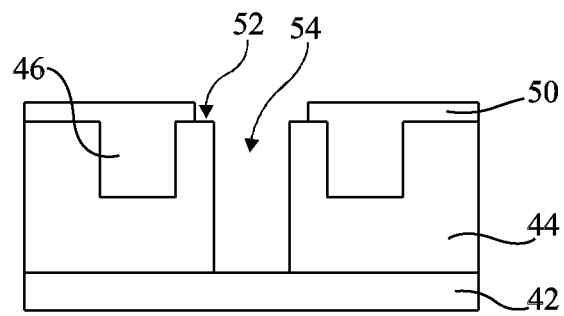

FIGS. 3A and 3B respectively are a top view and a cross-section view along plane B-B of FIG. 3A schematically illustrating another manufacturing step.

During this step, layer 50 is etched to form an opening 52 opposite a portion of region 48 where the active area is desired to be formed. Region 48 is etched through opening 52 to reach layer 42 to form a cavity 54 on the path of the light signal (i.e., aligned with the waveguide spindle). Cavity 54 has a parallelepipedal shape.

In the example of FIG. 3B, the lateral dimensions of opening 52 are larger than the lateral dimension of cavity 54. They could however be identical.

Figure 4A:
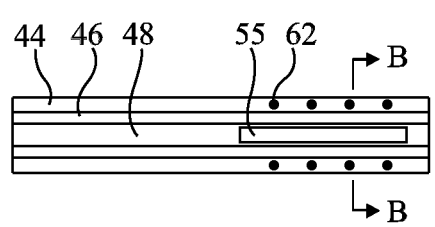
FIGS. 4A and 4B respectively are a top view and a cross-section view along plane B-B schematically illustrating another step of manufacturing of an embodiment of a converter of light signals into electric signals.
Figure 4B:
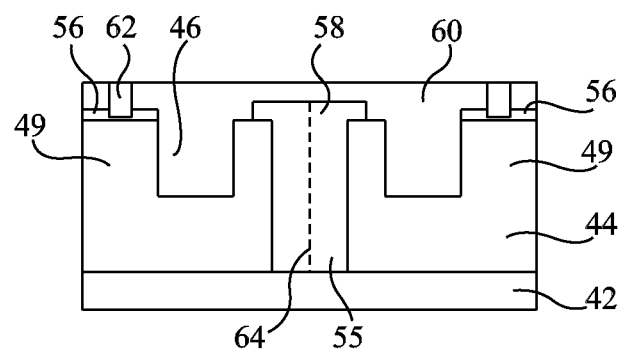

FIGS. 4A and 4B respectively are a top view and a cross-section view along plane B-B of FIG. 4A schematically illustrating another manufacturing step.

During this step, germanium is grown by epitaxy in cavity 54, for example, by using $GeH_4$, to form the active area of a photodiode. The active area comprises a region 55 in layer 44, formed by filling cavity 54 and optionally a region 58, extending beyond region 44, formed by filling opening 52. Region 58 is thus outside of layer 44.

Region 55 comprises, in cross-sections along planes orthogonal to the plane of layer 44, two sides, the lateral walls, in contact with layer 44, and one side, the lower surface, in contact with layer 42.

Connection pads 56 (not shown in FIG. 4A) are then formed on portions 49. The structure is then covered with a layer of insulator 60 (not shown in FIG. 4A). Vias 62 cross layer 60 to reach connection pads 56 and enable to measure the voltage between the two portions 49. This voltage represents data transmitted by the optical fiber in the same way as the voltage between vias 30 of FIGS. 1A to 1C.

The insulators of layers 42, 50, and 60 are selected to have a refraction index sufficiently different from that of silicon to contain the light signal. Layers 42, 50, and 60 are, for example, made of silicon oxide.

During this manufacturing process, the areas of layer 44 located between the active area and connection pads 56 are P type doped on one side, and N-type doped on the other side. This enables, among others, to modify the resistance between the photodiode and pads 56, and thus to modify, by a certain extent, the data transmission speed at the level of the converter.

It is thus possible to accurately control the intrinsic germanium width, by controlling the dimensions of cavity 54, while keeping P and N doped areas in another material, here, silicon of regions 49 on opposite sides of the intrinsic region 55.

It could have been thought to form an active area which does not reach layer 42. The germanium growth would then be performed from the lateral walls and the bottom of cavity 54, for example, with a same speed. However, when the germanium formed on one of these surfaces would join the germanium formed on another one of these surfaces, their meshes would not be properly aligned. This would cause the creation of many dislocations in the germanium, in several directions. Such dislocations would cause a loss of charge carriers and a loss of signal.

In the embodiment of FIGS. 4A and 4B, during the epitaxial growth step, the germanium only grows on the lateral walls of cavity 54. Region 55 filling cavity 54 then only comprises one regular central dislocation 64 which extends heightwise within the cavity 54.

Dislocation 64 extends along substantially the entire height of region 55 and along substantially the entire length thereof (in the direction orthogonal to the cross-section plane of FIG. 4B).

In practice, small dislocations, not shown and negligible, are present at the level of the walls. Such small dislocations are due to the lattice constant difference between germanium (5.658 Å) and silicon (5.431 Å). Such dislocations generally have a low impact on the transmitted signals.

Cavity 54, and thus region 55 of the active area, for example, has a width smaller than approximately 700 nm, for example in the range from approximately 400 nm to approximately 600 nm, for example in the range from 400 nm to 600 nm. The width of the cavity is defined as being the value of the cavity dimension in the direction common to the plane of layer 44 and to the cross-section plane of FIG. 4B. This enables to have a capacitance in region 55 smaller than the capacitance in portion 24 of FIGS. 1A and 1B. Such a structure may, for example, reach a transfer speed substantially equal to 50 Gbps.

Figure 5:
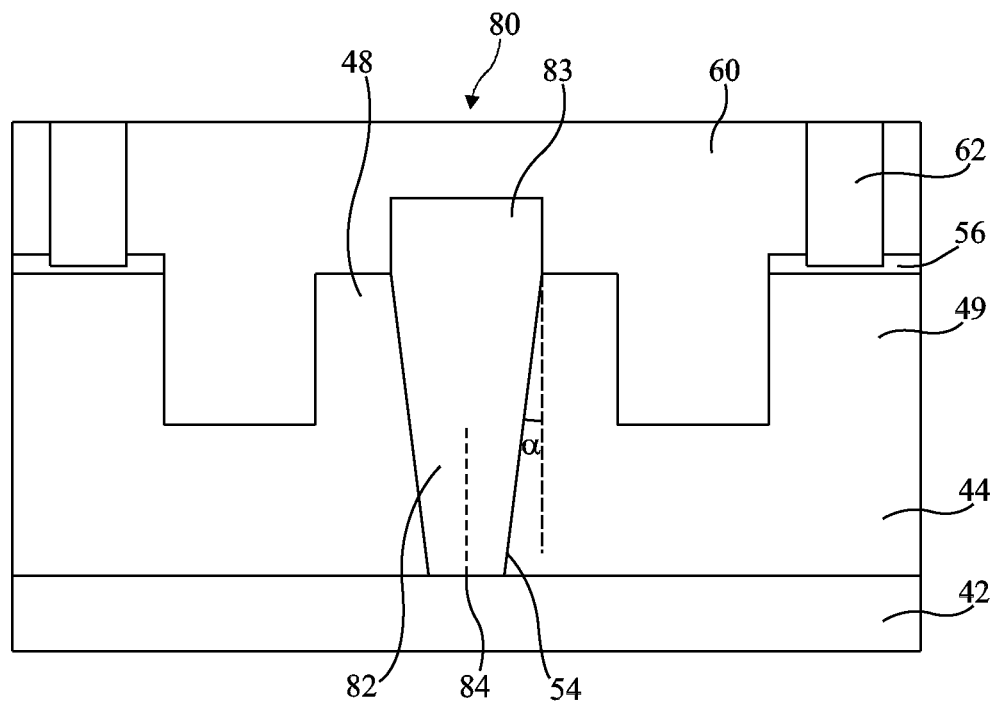
FIG. 5 is a cross-section view schematically illustrating another embodiment of a converter of light signals into electric signals.

FIG. 5 is a cross-section view schematically illustrating another embodiment of a converter 80 of light signals into electric signals.

The embodiment of FIG. 5 is obtained by a method similar to that described in relation with FIGS. 2A, 2B, 3A, 3B, 4A, and 4B, except for the shape of cavity 54.

In this embodiment, cavity 54 has, in cross-sections along planes orthogonal to the plane of layer 44, the shape of a trapezoid, for example, of an isosceles trapezoid. As previously, cavity 54, in a cross-section along a plane orthogonal to layer 44, for example, that shown in FIG. 5, comprises only two sides in contact with silicon layer 44, corresponding to the lateral walls of cavity 54. Further, the active area is, in this example, in contact, by its lower surface, with layer 42.

Angle α of a lateral wall of cavity 54 with respect to the vertical direction, that is, the direction orthogonal to the plane of layer 44, is, for example, greater than approximately 10°, for example, between approximately 10° and approximately 20°. Preferably, the angles α of the two opposed walls of cavity 54 are substantially equal.

During the epitaxial growth step, the germanium grows on the lateral walls of cavity 54 to form a region 82 in layer 44 and possibly a region 83 extending beyond layer 44. The germanium forming on the lower portion of the walls joins faster than in the upper portion, creating a dislocation 84 in the lower portion of cavity 54 without forming a significant dislocation therein. There thus is only one significant dislocation 84, located in the lower portion of region 82.

Further, angle α of the walls of cavity 54 enables to decrease the quantity of negligible small dislocations along each wall. Indeed, on etching of the silicon to form cavity 54 of FIG. 5, the silicon atoms are also etched and the dimension of each atom at the level of the cavity walls are then closer to the lattice constant of germanium than in the case of FIGS. 2A, 2B, 3A, 3B, 4A, and 4B.

Cavity 54, for example, has a width at the upper surface of layer 44 smaller than approximately 700 nm, for example, in the range from approximately 400 nm to approximately 600 nm, for example, in the range from 400 nm to 600 nm.

Figure 6:
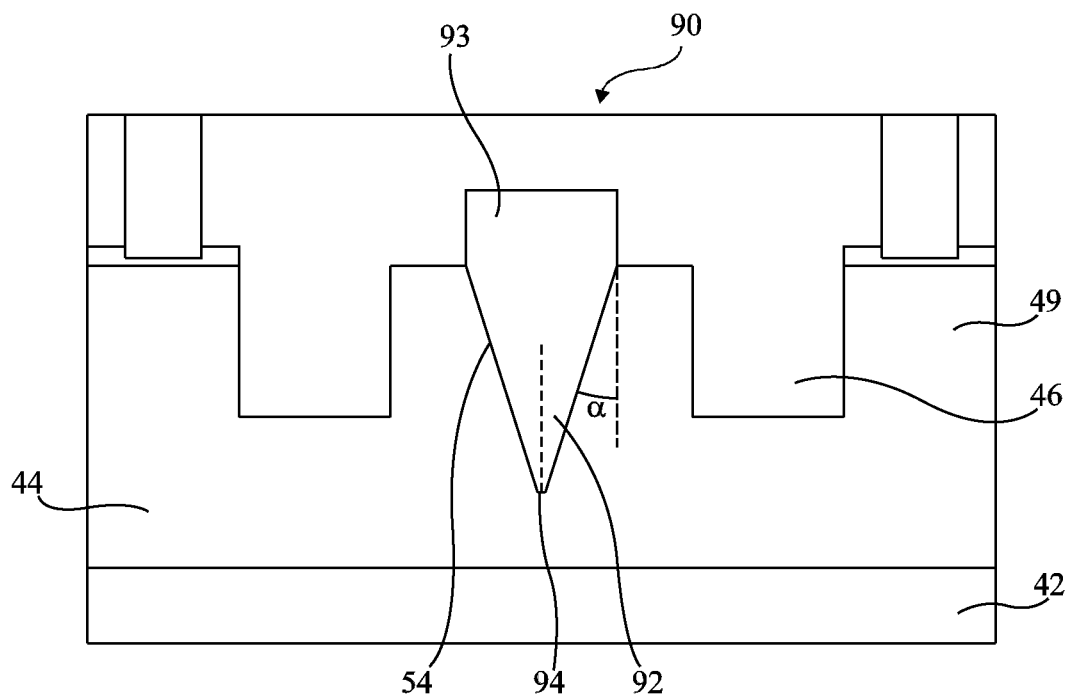
FIG. 6 is a cross-section view schematically illustrating another embodiment of a converter of light signals into electric signals.

FIG. 6 is a cross-section view schematically illustrating another embodiment of a converter 90 of light signals into electric signals.

To form the structure of FIG. 6, cavity 54 is etched to have, in cross-sections along planes orthogonal to the plane of layer 44, the shape of a triangle, for example, of an isosceles triangle. It is possible for the end of the triangle not to reach insulating layer 42, as in FIG. 6. More precisely, cavity 54 only comprises, in such a cross-section, two sides in contact with silicon, corresponding to the lateral walls of cavity 54. Thus, during the step of epitaxial growth, the germanium grows on the lateral walls of cavity 54 to form the active area comprising a region 92 in layer 44 and possibly a region 93 extending beyond cavity 54. Region 92 filling cavity 54 comprises only one significant dislocation, like the structure of FIG. 5.

Cavity 54, for example, has a width at the upper surface of layer 44 smaller than approximately 700 nm, for example, in the range from approximately 400 nm to approximately 600 nm, for example, in the range from 400 nm to 600 nm.

The angle α of a lateral wall of cavity 54 relative to the vertical direction, that is, the direction orthogonal to layer 44, is for example greater than 10°. Preferably, the angles α of the two opposed walls are substantially equal.

Specific embodiments have been described. Various alterations, modifications, and improvements will occur to those skilled in the art. In particular, the germanium fills, in the described drawings, cavity 54 and opening 52 in layer 50. As a variation, the germanium may fill cavity 54 only.

As a specific embodiment, the described converter is adapted to a light signal for example having a 1,310-nm wavelength or a 1,550-nm wavelength.

Various embodiments with different variations have been described hereabove. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:
1. A method, comprising:
  etching first and second trenches in a layer of semiconductor material to delimit a central region of semiconductor material, wherein the layer of semiconductor material is located on a first layer of insulating material;
  depositing a second layer of insulating material which fills the first and second trenches and covers the central region;

etching the second layer of insulating material and the layer of semiconductor material at the central region to form a cavity which extends completely through both the second layer of insulating material and the layer of semiconductor material to reach the first layer of insulating material and delimit a first portion of the central region and a second portion of the central region spaced apart from each other by said cavity; and epitaxially growing a semiconductor material different than a semiconductor material of said layer of semiconductor material in said cavity to form an active area of a photodiode.

2. The method of claim 1, wherein depositing the second layer of insulating material comprises depositing a stack of layers to form said second layer of insulating material.

3. The method of claim 2, wherein the stack of layers includes a silicon nitride layer and a silicon oxide layer.

4. The method of claim 1, wherein the cavity is aligned with a path of a light signal directed towards said photodiode.

5. The method of claim 1, wherein the semiconductor material of said layer of semiconductor material comprises silicon and the semiconductor material that is epitaxially grown comprises germanium.

6. The method of claim 1, further comprising:
forming a first doped region within the layer of semiconductor material adjacent a first side wall of the cavity, said first doped region being doped with a first conductivity type dopant; and
forming a second doped region within the layer of semiconductor material adjacent a second side walls of the cavity opposite said first side wall, said second doped region being doped with a second conductivity type dopant.

7. A method, comprising:
etching first and second trenches in a layer of semiconductor material to delimit a central region of semiconductor material, wherein the layer of semiconductor material is located on a first layer of insulating material;
depositing a second layer of insulating material which fills the first and second trenches and covers the central region;
etching the second layer of insulating material and the layer central region of semiconductor material at the central region to form a cavity which extends completely through both the second layer of insulating material and the layer central region of semiconductor material to delimit a first portion of the central region and a second portion of the central region spaced apart from each other by said cavity; and
epitaxially growing a semiconductor material different than a semiconductor material of said layer of semiconductor material in said cavity to form an active area of a photodiode;
wherein an angle between a direction orthogonal to a plane where the layer of semiconductor material contacts the first layer of insulating material and a plane of opposed side walls of the cavity is greater than approximately 10°.

8. The method of claim 7, wherein said angle is in a range from approximately 10° to approximately 20°.

9. The method of claim 7, wherein depositing the second layer of insulating material comprises depositing a stack of layers to form said second layer of insulating material.

10. The method of claim 7, wherein the semiconductor material of said layer of semiconductor material comprises silicon and the semiconductor material that is epitaxially grown comprises germanium.

11. The method of claim 7, further comprising:
forming a first doped region within the layer of semiconductor material adjacent a first side wall of the cavity, said first doped region being doped with a first conductivity type dopant; and
forming a second doped region within the layer of semiconductor material adjacent a second side walls of the cavity opposite said first side wall, said second doped region being doped with a second conductivity type dopant.

12. A method, comprising:
etching first and second trenches in a layer of semiconductor material to delimit a central region of semiconductor material, wherein the layer of semiconductor material is located on a first layer of insulating material;
depositing a second layer of insulating material which fills the first and second trenches and covers the central region;
etching the second layer of insulating material and the central region of semiconductor material to form a cavity which extends completely through the second layer of insulating material and only partially through the central region of semiconductor material to delimit a first portion of the central region and a second portion of the central region spaced apart from each other by said cavity;
wherein opposed side walls of said cavity contact each other at a bottom of the cavity, and wherein the cavity, in cross section perpendicular to the lower surface, has a shape of a triangle; and
epitaxially growing a semiconductor material different than a semiconductor material of said layer of semiconductor material in said cavity to form an active area of a photodiode.

13. The method of claim 12, wherein depositing the second layer of insulating material comprises depositing a stack of layers to form said second layer of insulating material.

14. The method of claim 13, wherein the stack of layers includes a silicon nitride layer and a silicon oxide layer.

15. The method of claim 12, wherein the cavity is aligned with a path of a light signal directed towards said photodiode.

16. The method of claim 12, wherein the semiconductor material of said layer of semiconductor material comprises silicon and the semiconductor material that is epitaxially grown comprises germanium.

17. The method of claim 12, further comprising:
forming a first doped region within the layer of semiconductor material adjacent a first side wall of the cavity, said first doped region being doped with a first conductivity type dopant; and
forming a second doped region within the layer of semiconductor material adjacent a second side walls of the cavity opposite said first side wall, said second doped region being doped with a second conductivity type dopant.

18. A method, comprising:
etching first and second trenches in a layer of semiconductor material to delimit a central region of semiconductor material, wherein the layer of semiconductor material is located on a first layer of insulating material;
depositing a second layer of insulating material which fills the first and second trenches and covers the central region;

etching the second layer of insulating material and the central region of semiconductor material to form a cavity which extends completely through the second layer of insulating material and only partially through the central region of semiconductor material to delimit a first portion of the central region and a second portion of the central region spaced apart from each other by said cavity; and epitaxially growing a semiconductor material different than a semiconductor material of said layer of semiconductor material in said cavity to form an active area of a photodiode;

wherein an angle between a direction orthogonal to a plane where the layer of semiconductor material contacts the first layer of insulating material and a plane of opposed side walls of the cavity is greater than approximately 10°.

19. The method of claim 18, wherein said angle is in a range from approximately 10° to approximately 20°.

20. The method of claim 18, wherein depositing the second layer of insulating material comprises depositing a stack of layers to form said second layer of insulating material.

21. The method of claim 18, wherein the semiconductor material of said layer of semiconductor material comprises silicon and the semiconductor material that is epitaxially grown comprises germanium.

22. The method of claim 18, further comprising:
forming a first doped region within the layer of semiconductor material adjacent a first side wall of the cavity, said first doped region being doped with a first conductivity type dopant; and
forming a second doped region within the layer of semiconductor material adjacent a second side walls of the cavity opposite said first side wall, said second doped region being doped with a second conductivity type dopant.

* * * * *